United States Patent [19]

Chiba et al.

[11] Patent Number: 4,938,798

[45] Date of Patent: Jul. 3, 1990

[54] SPUTTERING TARGET AND PROCESS FOR PREPARING THE SAME

[75] Inventors: Yoshitaka Chiba, Gyoda; Noriyoshi Hirao; Toru Sugihara, both of Kumagaya; Kenji Hasegawa, Saitama, all of Japan

[73] Assignee: Hitachi Metals, Ltd., Tokyo, Japan

[21] Appl. No.: 165,038

[22] Filed: Mar. 7, 1988

[30] Foreign Application Priority Data

Mar. 9, 1987 [JP] Japan .................................. 62-53292

[51] Int. Cl.$^5$ ............................................ C22C 29/00
[52] U.S. Cl. ......................................... 75/230; 75/245; 75/248; 419/10; 419/23; 419/33; 419/34; 419/38; 419/45; 419/53; 419/55; 419/60; 501/96; 501/154; 204/298.13; 252/625; 252/644
[58] Field of Search .......................... 75/245, 230, 248; 419/10, 23, 33, 34, 38, 45, 53, 55, 60; 501/96, 154; 204/298; 252/625, 644

[56] References Cited

U.S. PATENT DOCUMENTS

| | | | |
|---|---|---|---|
| 3,883,314 | 5/1975 | Schnyder et al. | 419/27 |
| 4,619,697 | 10/1986 | Hijikata et al. | 75/230 |
| 4,820,393 | 4/1989 | Brat et al. | 419/13 |

FOREIGN PATENT DOCUMENTS 61-141673 of 1986 Japan.
61-141674 of 1986 Japan.
61-145828 of 1986 Japan.

OTHER PUBLICATIONS

P. S. Ho et al., "Thin Films and Interfaces", Proc. Mat. Res. Soc., Nov. 1981, pp. 351-356.

*Primary Examiner*—Stephen J. Lechert, Jr.
*Assistant Examiner*—Nina Bhat
*Attorney, Agent, or Firm*—Finnegan, Henderson, Farabow, Garrett & Dunner

[57] ABSTRACT

A high melting metal silicide sputtering target which comprises a fine texture whose stoichiometric composition grains of $MSi_2$, where M represents a high melting metal, have a maximum grain size of 20 μm, whose free silicon grains have a maximum grain size of 50 μm and whose oxygen content is not more than 200 ppm and has a density ratio to the theoretical density of 99% or more has good film characteristics including the reduction in the number of grains formed on the sputtered film and is useful as an electrode material or a wiring material in semi-conductor devices.

5 Claims, 2 Drawing Sheets

MAGNIFICATION : X600

WSi2 GRAINS (IN WHITE)
FREE Si GRAINS (IN BLACK)

MAGNIFICATION : X600

MAGNIFICATION : X600

SPUTTERING TARGET AND PROCESS FOR PREPARING THE SAME

BACKGROUND OF THE INVENTION

This invention relates to a high melting silicide target for use as an electrode material or a wiring material in a semi-conductor device, particularly a sputtering target having a fine texture and a high density and a process for preparing the same.

Recently, high melting metal silicides such as silicides of molybdenum, tungsten, titanium, etc. having a low resistivity have been used as electrode materials or wiring materials for LSI and ultra LSI. In order to form films of high melting point metal silicides, sputtering and chemical vapor phase deposition processes have been used. From the viewpoint of film productivity and safety at the film production, the sputtering process is mainly used.

Heretofore, such silicide targets have been prepared by melting or powder sintering. In order to prevent cracking of the targets due to sputtering or prevent formation of projections or asperities on the target surface due to local electric discharge during the sputtering, various processes for preparing targets of high density, thereby reducing the voids in the target, have been proposed.

For example, Japanese Patent Application Kokai (Laid-Open) No. 61-145828 discloses that a high density target can be obtained by mixing high purity, high melting metal powder with high purity silicon powder, molding the resulting mixture under pressure, sintering the molding with heating and melting the sintered product with an electron beam, thereby producing a molten silicide product, where the molten silicide product texture contains crystal grains having grain sizes of 0.2 to 0.5 mm owing to the electron beam melting.

Japanese Patent Application Kokai (Laid-Open) Nos. 61-141673 and 61-141674 disclose that a high density target can be obtained by mixing molybdenum or tungsten powder with silicon powder, followed by molding and silicidizing, and disintegrating the resulting pellets into powder and hot pressing the powder, thereby producing a sintered product.

Japanese Patent Application Kokai (Laid-Open) No. 61-141673 proposes a process for increasing the purity of the target based on the so called wet refining procedure comprising dissolution in nitric acid and successive dissolution in ammonia with heating in order to reduce the contents of alkali metals and radioactive elements.

As described above, various processes have been proposed for preparing high density targets in order to reduce the voids in the targets. The process utilizing electron beam melting has the disadvantages that the molten silicide product texture contains crystal grains having grain sizes of 0.2 to 0.5 mm and thus the target texture cannot be made finer and further that changes on the sputtered surface due to structurally different stoichiometric compositions $MSi_2$ where M stands for a high melting point metal, such as $WSi_2$, $MoSi_2$, $TiSi_2$, etc. and also due to free Si grains, cannot be thoroughly reduced.

The process utilizing silicidizing, followed by disintegration of pellets into powder and hot pressing of the powder, thereby obtaining a sintered product, has the disadvantages that the oxygen content of the resulting powder is increased during the disintegration of the pellets, so that no better film can be formed.

SUMMARY OF THE INVENTION

An object of the present invention is to provide an ultra high purity sputtering target with reduced of alkali metals, radioactive elements such as U, Th, etc., and oxygen, by forming a target of higher density, thereby reducing the voids in the target and reducing imperfections on the sputtered surface. The present sputtering target is intended to be used as an electrode material or a wiring material in semi-conductor devices.

According to a first aspect of the present invention there is provided a sputtering target, which comprises a fine textured material whose stoichiometric composition include grains of $MSi_2$, where M represents a high melting point metal, having a maximum grain size of 20 $\mu$m, whose free silicon grains have a maximum grain size of 50 $\mu$m and whose oxygen content is not more than 200 ppm, and having a density ratio (the ratio of measured density to the theoretical density) of 99% or more.

According to a second aspect of the present invention there is provided a sputtering target, which has a purity of a 99.99% or higher, comprising a fine textured material whose uranium and thorium contents are not more than 0.1 ppm, whose sodium and potassium contents are not more than 1 ppm, whose oxygen content is not more than 200 ppm, whose stoichiometric composition grains of $MSi_2$, where M represents a high melting metal, have a maximum grain size of 20 $\mu$m and whose free silicon has a maximum grain size of 50 $\mu$m, and having a density ratio (the ratio of measured density to the theoretical density) of 99% or higher.

The high melting metal for use in the present invention includes tungsten, molybdenum, titanium, tantalum, etc. The reason for use of particularly high purity metals in the present invention is to obtain a good film, and the reasons for the uranium (U) and thorium (Th) contents of not more than 0.1 ppm and the sodium (Na) and potassium (K) contents of not more than 1 ppm are to prevent occurrences of mobile ions which can lead to maloperation. The reason for the oxygen content of not more than 200 ppm is to lower the electrical "sheet resistance" of the film. The reason for the maximum free silicon (Si) grain size of 50 $\mu$m is that above 50 $\mu$m free silicon grains are preferentially sputtered and surface anomalies such as projections or asperities, etc. cannot be reduced. The reason for the density ratio of 99% or higher is that below 99% the voids in the target are subject to abnormal electric discharge, and the surface anomalies such as projections, etc. cannot be reduced.

A third aspect and a fourth aspect of the present invention are to provide processes for preparing targets corresponding to the first aspect and the second aspect of the present invention, respectively.

A fifth aspect of the present invention is to provide a process for preparing a target based on disintegration of a calcined product to powder having particle sizes of 30 mesh (500 $\mu$m or less) in an argon (Ar)-sealed ball mill.

A process for preparing a silicide sputtering target, using tungsten (W) as a high melting point metal, will be described in detail below:

In order to obtain tungsten powder of high purity, disintegrated tungsten powder or tungsten trioxide powder having a purity of 99.9% is allowed to react with a hydrogen fluoride (HF) gas to form a $WF_6$ gas The boiling point of $WF_6$ is 18.6° C., that of $UF_6$ is 64° C., that of $ThF_4$ is 1,680° C., that of NaF is 1,705° C. and that of KF is 1,505° C. Thus, $WF_6$ can be readily isolated as a liquid from the impurities contained in the $WF_6$ gas by distillation while keeping the $WF_6$ gas at 15° C. The liquefied $WF_6$ can be dissolved into aqua ammonia with heating. The solution is filtered, and the filtrate is concentrated with stirring under steam heating to obtain ammonium paratungstate having a crystallinity of about 85% and an average particle size of about 3.7 μm. Then, the ammonium paratungstate is oxidized to $WO_3$, which is heated at 850° C. in a hydrogen reduction furnace, whereby tungsten powder of ultra high purity having a maximum particle size of about 15 μm can be obtained.

The thus obtained tungsten powder is mixed with silicon powder having a purity of 6N and a maximum particle size of about 20 μm in a V-shaped blender. The target composition as a product greatly depends upon the of particle sizes of raw material powder. When the particle sizes of raw material powder are larger than the desired particle size, the raw material powder can be further disintegrated by a ball mill or a disc mill and screened to adjust the particle sizes to the desired ones.

The tungsten powder is mixed with the silicon powder generally in a mixing ratio ranging from $WSi_{2.5}$ to $WSi_{3.0}$, for example, in a mixing ratio of $WSi_{2.75}$.

The powder mixture is formed ultimately into stable $WSi_2$ through a metastable composition $W_5Si_3$ by silicidizing reaction, while Si taking no part in the reaction to $WSi_2$ remains as free Si. In case of $WSi_{2.75}$, the resulting texture is composed of 91.9% by weight of $WSi_2$ grains and 8.1% by weight of free Si grains.

The silicidizing reaction is carried out with heating at a temperature of 1,200° to 1,400° C. under vacuum of $10^{-4}$ Torr or higher. Below 1,200° C., a longer reaction time is required to obtain the stable $WSi_2$, resulting in poor productivity and a higher oxygen content such as 530 ppm. Thus, the heating to 1,200° C. or higher is indispensable. Above 1,410° C., a calcined product of low oxygen content such as 40 ppm can be obtained, but $WSi_2$ and Si grow into coarser grains. Thus, the heating up to 1,400° C. is indispensable.

Then, the calcined product is placed in a sealable vessel for compact pressing without disintegrating the calcined product, and after evacuation of the container to an appropriate vacuum, the calcined product is sintered at a temperature of 1,100° to 1,250° C., at which the texture fails to grow into coarser grains, in a hot hydraulic press, whereby a desired target can be obtained. The reason why the calcined product is not subjected to disintegration to powder is that, when it is disintegrated in the atmosphere, the oxygen content will be increased with decreasing particle size of the disintegrated powder, for example, the oxygen content will be increased to as much as 480 ppm when the particle size of disintegrated powder is less than 20 μm. Thus, in case that the disintegration to powder is necessary, a special disintegration procedure such as argon (Ar)-sealed ball milling, etc. must be used, whereby pulverized powder of low oxygen content can be obtained.

The calcined product placed in the sealable container for compact pressing is heated at 200° to 1,200° C. in a vacuum of $10^{-4}$ Torr or higher to release the surface-adsorbed gas or moisture. By the heating below 200° C., no adsorbed gas is released, whereas by the heating above 1,200° C., the grains in the texture are made coarser. Thus, the desirable heating temperature is 200° to 1,200° C.

Sintering can be more effectively carried out in a hot isostatic press to obtain a higher density and a more homogeneous deformation than by sintering under atmospheric pressure or in a hot press. The higher the temperature and pressure, the higher the density of the target. By heating below 1,100° C., a target having a density of 99% or higher cannot be obtained, whereas by heating above 1,200° C., the sealable container for compact pressing, which is made from a high pressure grade steel pipe, reacts with Si, or the texture is made coarser. Thus, a desirable sintering temperature in the hot hydraulic press is 1,100° to 1,200° C.

BRIEF DESCRIPTION OF THE DRAWINGS

FIG. 1b is a partial schematic view for explaining the metallographic picture of FIG. 1a.

PREFERRED EMBODIMENTS OF THE INVENTION

EXAMPLE 1

Figure 1A:
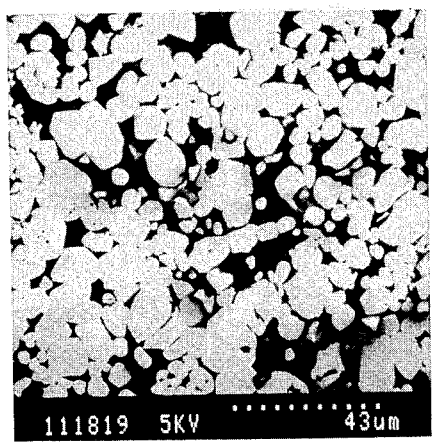
FIG. 1a is a metallographic picture by a scanning type, electron microscope of the target according to Example 1 of the present invention.

A sputtering target of ultra-high purity whose high melting point metal was tungsten was prepared.

First, ultra-high purity, high melting tungsten powder was prepared from tungsten powder having a purity of 99.9% in the same manner as described before, i.e. by allowing the tungsten powder to react with HF gas to form tungsten fluoride, and purifying the tungsten fluoride by distillation, thereby removing U, Th, Na and K therefrom, followed by ammoniation, oxidation and successive reduction.

Then, 10,560 g of the thus obtained tungsten powder having an ultra-high purity of 4N5 or higher and particle sizes of less than 15 μm was mixed with 4,440 g of silicon powder having a purity of 6N and particle sizes of less than 20 μm. Then, the mixture was heated at a temperature of 1,250° C. under a vacuum of $2 \times 10^{-5}$ Torr for 4 hours to obtain a calcined product, 350 mm in diameter and 50 mm thick.

Then, the calcined product was placed in a sealable container for compact pressing without disintegration to powder, and an upper lid with a vent port was welded to the container. The calcined product was heated to 270° C. for 2 hours, while evacuating the container to a vacuum of $5 \times 10^{-5}$ Torr through the vent port to release the surface-adsorbed gases and moisture from the calcined product. Then, the calcined product was sintered at 1,180° C. under a pressure of 1,000 atmospheres for 3 hours in a hot hydraulic press to obtain a sintered product, 290 mm in diameter and 50 mm thick.

The sintered product was machine processed to 245 mm in diameter and 6 mm thick, subjected to ultrasonic washing in acetone and then heated at 1,000° C. in vacuum for one hour to remove Na and K, whereby an ultra-high purity target was obtained.

EXAMPLE 2

A high purity sputtering target whose high melting point metal was tungsten was prepared.

10,560 g of tungsten powder having a purity of 4N5 and particle sizes of less than 15 μm was mixed with silicon powder having a purity of 6N and particle sizes of less than 20 μm, and the mixture was heated at a temperature of 1,380° C. under a vacuum of $2\times10^{-5}$ Torr for 4 hours to obtain a calcined product, 350 mm in diameter and 50 mm thick.

Then, the calcined product was placed in a sealable container for compact pressing without disintegration to powder, and an upper lid with a vent port was welded to the container. The calcined product was heated to 270° C. for 2 hours, while evacuating the container to $5\times10^{-5}$ Torr through the vent port to release the surface adsorbed gases and moisture. Then, the calcined product was sintered at 1,180° C. under a pressure of 1,000 atmospheres for 2 hours in a hot hydraulic press to obtain a sintered product, 290 mm in diameter and 50 mm thick. Then, a target, 245 mm in diameter and 6 mm thick, was prepared therefrom in the same manner as in Example 1.

Comparative Example 10,560 g of tungsten powder having a purity of more than 4N5 and particle sizes of less than 15 μm was mixed with silicon powder having a purity of 6N and particle sizes of less than 150 μm, and the mixture was heated at 1,300° C. under a vacuum of $2\times10^{-5}$ Torr for 4 hours to obtain a calcined product, 350 mm in diameter and 50 mm thick. Then, a target, 245 mm in diameter and 6 mm thick, was prepared therefrom in the same manner as in Example 1.

The targets of Examples 1 and 2 were found by measurements to have substantially same purities and impurity contents, and thus the results are shown in Table 1 as summarized under the heading "Example". Furthermore, the targets of Examples 1 and 2 were found by measurements to have substantially same density ratios, WSi₂ particle sizes and free Si particle sizes and thus the results are shown in Table 2 as summarized under the heading "Example".

In Tables 1 and 2, results of measurements of a commercially available target of the same composition are shown for comparison as Conventional Example together with Comparative Example.

TABLE 2

| Items | Particle size of raw material powder (μm) | | Density ratio of target (%) | Grain size in target (μm) | |
|---|---|---|---|---|---|
| | W powder | Si powder | | WSi₂ grain | Free Si grain |
| Example (the invention) | <15 | <20 | 99.2 | <15 | <20 |
| Comparative Example | <15 | <150 | 99.0 | <15 | <150 |
| Conventional Example | — | — | 89.5 | <30 | <125 |

As in obvious from Tables 1 and 2, the targets of the present invention of the Example have a higher purity, less impurities, a higher density and a finer texture than that of the Conventional Example, and the target of the Comparative Example has a purity, impurities and density similar to those of Example, but has a considerably larger free Si grain size than that of the Example. The oxygen content of the target of Example 2 was found by measurement to be 175 ppm, whereas that of Conventional Example was found to be 153 ppm and that of Comparative Example was found to be 356 ppm.

Figure 1B:
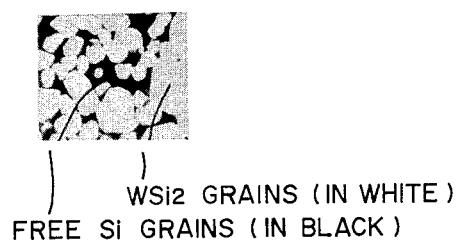
Figure 2:
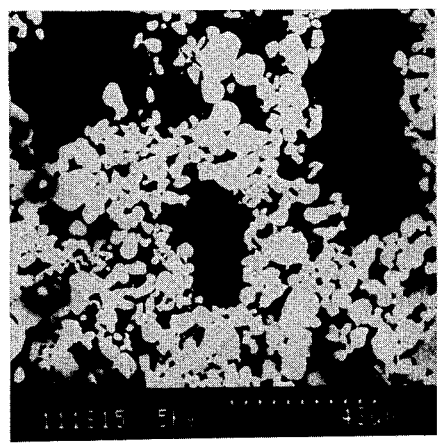
FIG. 2 is a metallographic picture by a scanning type electron microscope of the target according to a Comparative Example.

Electron microscope pictures (magnification: x600) of the textures of targets of Example 1 and the Comparative Example are shown in FIG. 1a and FIG. 2, respectively, and it can be seen therefrom that the target of Example 1 has a finer texture than that of the Comparative Example. FIG. 1b is a schematic view for explaining FIG. 1a, and it can be seen therefrom in the targets of the present invention that WSi₂ has grain sizes of less than 15 μm and the free Si has grain sizes of less than 20 μm.

Figure 3:
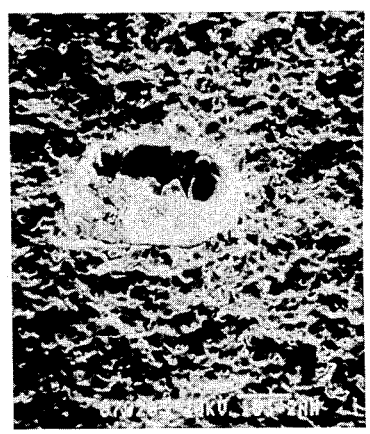
FIG. 3 is a metallographic picture by a scanning type electron microscope of an asperity observable on the surface of the target according to Example 1 after sputtering for 150 minutes.

The target of Example 1 was machine processed to 75 mm in diameter and 6 mm thick, and fixed to a backing plate by bonding, and then subjected to sputtering at a power of 300 W under an argon pressure of $2\times10^{-3}$ Torr for 150 minutes in an RF magnetron sputtering apparatus. As a result, projections as shown in the metallographic picture by a scanning type electron microscope of FIG. 3 were formed on the target surface. Targets of Examples 1 and 2 were found by measurement with a surface roughness meter to have the same number of projections on the target surfaces. The results are shown in Table 3 as summarized under the heading "Example". In Table 3, number of projections formed on the target surfaces of the Comparative Example and the Conventional Example by the same sputtering as given to the target of Example 1 and measured in the same manner as above is shown. Magnification of the picture in FIG. 3 is ×600.

TABLE 1

| Items | Composition | Purity | Impurity (ppm) | | | | Impurity (ppb) | |
|---|---|---|---|---|---|---|---|---|
| | | | Fe | Na | K | O₂ | U | Th |
| Example (The invention) | WSi₂.₇₅ | 4N5 | 1.2 | 0.2 | 0.1 | 175 | 0.4 | 0.1 |
| Comparative Example | WSi₂.₇₅ | 4N5 | 1.2 | 0.2 | 0.1 | 153 | 0.4 | 0.1 |
| Conventional Example | WSi₂.₇₅ | 4N | 8.7 | 1.4 | 1.0 | 356 | 3.3 | <10 |

TABLE 3

| Items | Number of projections formed on the surface after sputtering for 45 minutes | Number of projections formed on the surface after sputtering for 150 minutes |
| --- | --- | --- |
| Example (the invention) | 0 | 10 |
| Comparative Example | 5 | 64 |
| Conventional Example | 12 | 87 |

As is obvious from Table 3, the targets of the Example have a considerably smaller number of projections formed on the target surfaces than those of the Comparative Example and the Conventional Example.

In the foregoing Examples, tungsten silicide targets were prepared, but the present invention is also applicable to targets of high melting point silicides such as molybdenum silicide, titanium silicide, tantalum silicide, etc. and is also applicable to a mosaic form sputtering target.

In the present targets and the target obtained according to the process of the present invention, the number of projections to be formed on the target surfaces can be reduced during the sputtering, and good film characteristics including the reduction in the number of grains formed on the sputtered film are expected. Thus, the present sputtering target is useful as an electrode material and a wiring material in semi-conductor devices.

What is claimed is:

1. A high melting point metal silicide-based sputtering target for use as an electrode material or a wiring material in semi-conductor devices, which comprises a fine textured non-stoichiometric material whose stoichiometric composition grains of $MSi_2$, where M represents a high melting point metal, have a maximum grain size of 20 $\mu$m, whose free silicon grains have a maximum grain size of 50 $\mu$m, whose oxygen content is not more than 200 ppm, and which has a density with respect to the theoretical density of 99% or more.

2. A high melting point metal silicide-based target for use as an electrode material or a wiring material in semi-conductor devices which comprises a fine textured non-stoichiometric material whose uranium and thorium contents are not more than 0.1 ppm, whose sodium and potassium contents are not more than 1 ppm, whose oxygen content is not more than 200 ppm, whose stoichiometric composition grains of $MSi_2$, where M represents a high melting point metal, have a maximum grain size of 20 $\mu$m, whose free silicon grains have a maximum grain size of 50 $\mu$m, which has a density with respect to the theoretical density of 99% or higher, and which has a purity of 99.99% or higher.

3. A process for preparing a high melting point metal silicide-based sputtering target for use as an electrode material or a wiring material in semiconductor devices, which comprises mixing high purity, high melting point metal powder having particle sizes of about 15 $\mu$m or less with an excess over a stoichiometric amount of high purity silicon powder having particle sizes of about 20 $\mu$m or less, subjecting the resulting mixture to silicidizing reaction in a high vacuum, thereby obtaining a calcined product, placing the calcined product in a sealable vessel for compact pressing, sealing the vessel after evacuation of the vessel into a vacuum, and sintering the calcined product in a hot isostatic press while pressing to a density of 99% or higher with respect to the theoretical density.

4. A process for preparing a high melting point metal silicide-based sputtering target for use as an electrode material or a wiring material in semi-conductor devices, which comprises mixing ultra high purity, high melting metal powder obtained by subjecting high melting point metal powder having a purity of 99.99% or greater to reaction with a hydrogen fluoride gas in advance, thereby forming a metal fluoride, purifying the metal fluoride through distillation, thereby removing uranium, thorium, sodium and potassium therefrom, followed by ammoniation, oxidation, and successive reduction with high purity silicon powder, subjecting the mixture to silicidizing reaction in a high vacuum, thereby forming a calcined product, placing the calcined product in a sealable container for compact pressing, sealing the container after evacuation of the container to a vacuum, and sintering the calcined product in a hot isostatic press.

5. A process for preparing a high melting point metal silicide-based sputtering target for use as an electrode material or a wiring material in semi-conductor devices, which comprises mixing high density, high melting point metal powder having a purity of 99.99% or greater with an excess over stoichiometric amount of high purity silicon powder, subjecting the resulting mixture to silicidizing reaction in a high vacuum, thereby obtaining a calcined product, disintegrating the calcined product to powder having sizes of 30 mesh and under in an argon-sealed ball mill, placing the disintegrated powder in a sealable vessel for compact pressing, sealing the vessel after evacuation of the vessel into a vacuum, and sintering the calcined product in a hot isostatic press while pressing to a density of 99% or higher with respect to the theoretical density.

* * * * *